United States Patent
Li et al.

(10) Patent No.: US 7,723,139 B2
(45) Date of Patent: May 25, 2010

(54) QUANTUM WELL INTERMIXING

(75) Inventors: Yabo Li, Acton, MA (US); Kechang Song, Painted Post, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 473 days.

(21) Appl. No.: 11/906,247

(22) Filed: Oct. 1, 2007

(65) Prior Publication Data

US 2009/0086784 A1   Apr. 2, 2009

(51) Int. Cl.
*H01L 21/00* (2006.01)
(52) U.S. Cl. .............................. 438/45; 438/36; 438/46; 438/47
(58) Field of Classification Search ................ 438/23, 438/29, 32, 34, 36, 37, 39, 41, 42, 44, 45–47
See application file for complete search history.

(56) References Cited

U.S. PATENT DOCUMENTS

| | | | |
|---|---|---|---|
| 4,873,691 A | 10/1989 | Uomi et al. | 372/20 |
| 4,995,048 A | 2/1991 | Kuindersma et al. | 372/50 |
| 5,707,890 A * | 1/1998 | Emery et al. | 438/29 |
| 5,843,802 A | 12/1998 | Beernink et al. | 438/45 |
| 6,027,989 A | 2/2000 | Poole et al. | 438/522 |
| 6,632,684 B2 | 10/2003 | Marsh et al. | 438/7 |
| 6,643,306 B2 | 11/2003 | Fukunaga | 372/45 |
| 6,650,675 B2 | 11/2003 | Sahara et al. | 372/50 |
| 6,674,778 B1 * | 1/2004 | Lin et al. | 372/46.01 |
| 6,778,573 B2 | 8/2004 | Hayakawa et al. | 372/43 |
| 6,878,562 B2 * | 4/2005 | Ooi et al. | 438/22 |
| 6,891,666 B2 * | 5/2005 | Darling et al. | 359/344 |
| 6,984,538 B2 * | 1/2006 | Ooi et al. | 438/22 |

(Continued)

FOREIGN PATENT DOCUMENTS

WO   02/059952   8/2002

(Continued)

OTHER PUBLICATIONS

"Strip-geometry quantum well heterostructure $Al_xGa_{1-x}$ As-GaAs Lasers defined by defect diffusion," D. G. Deppe, Applied. Phys. Lett. 49 (9) Sep. 1, 1986 pp. 510-512.

(Continued)

*Primary Examiner*—Kevin M Picardat
(74) *Attorney, Agent, or Firm*—Kwadjo Adusei-Poku

(57) ABSTRACT

Embodiments of a method of quantum well intermixing (QWI) comprise providing a wafer comprising upper and lower epitaxial layers, which each include barrier layers, and a quantum well layer disposed between the upper and lower epitaxial layers, applying at least one sacrificial layer over the upper epitaxial layer, and forming a QWI enhanced region and a QWI suppressed region by applying a QWI enhancing layer over a portion of the sacrificial layer, wherein the portion under the QWI enhancing layer is the QWI enhanced region, and the other portion is the QWI suppressed region. The method further comprises the steps of applying a QWI suppressing layer over the QWI enhanced region and the QWI suppressed region, and annealing at a temperature sufficient to cause interdiffusion of atoms between the quantum well layer and the barrier layers of the upper epitaxial layer and the lower epitaxial layer.

26 Claims, 4 Drawing Sheets

U.S. PATENT DOCUMENTS

| | | | |
|---|---|---|---|
| 6,989,286 B2 | 1/2006 | Hamilton et al. | 438/36 |
| 7,151,061 B1 | 12/2006 | Li et al. | 438/797 |
| 2004/0120377 A1 | 6/2004 | Marsh et al. | 372/45 |
| 2005/0153473 A1 | 7/2005 | Teng et al. | 438/47 |
| 2007/0110114 A1 | 5/2007 | Reithmaier et al. | 372/50.1 |

FOREIGN PATENT DOCUMENTS

| | | |
|---|---|---|
| WO | WO03/038487 | 5/2003 |
| WO | 03/085742 | 10/2003 |
| WO | 03/100823 | 12/2003 |

OTHER PUBLICATIONS

"Interdiffusion between GaAs and AlAs," L. L. Chang Applied Phys. Lett. vol. 29, No. 3, Aug. 1, 1976.

"Atom diffusion and impurity-induced layer disordering in quantum well III-V semiconductor heterostructures," D. G. Deppe, et al J. Appl. Phys. 64 (12) Dec. 15, 1988 pp. R93-R113.

"Ion millin damage in InP and GaAs," S. J. Pearton, J. Appl. Phys. 68 (6) Sep. 15, 1990 pp. 2760-2768.

"Characterization of $Wn_x$/GaAs Schottky Contacts Formed by Reactive RF Sputtering," Haruo Yamagishi, et al Jp. J. of Applied Physics vol. 26, No. 1, Jan. 1987 pp. 122-0129.

"Postgrowth Control of GaAs/AlGaAs Quantum Well Shapes by Impurity=Free VacancyDiffusion," I. Gontijo, et al IEEE J. of Quantum Elec. vol. 30. No. 5 May 1994, pp. 1189-1195.

"Area Selectivity of InGaAsP-InP Multiquantum-Well Intermixing by Impurity-Free Vacancy Diffusion," Sang Kee Si, et al IEEE J. of Selected Topics in Quantum Electronics, vol. 4, No. 4, Jul./Aug. 1998, pp. 619-623.

"Monolithic Integration in InGaAs-InGaAsP Multiple-Quantum-Well Structures Using Laser Intermixing," Andrew McKee, e tal IEEE J. of Quantum Electronics, vol. 33, No. 1, Jan. 1997.

"Structural properties and nitrogen-loss characteristics in sputtered tungsten nitride films," Y. G. Shen, et al Thin Solid Films 372 (2000) pp. 257-264.

"Introduction to the Issue on Interdiffused Quantum-Well Materials and Devices," IEEE J. of Selected Topics in Quantum Electronics, vol. 4, No. 4 Jul./Aug. 1998 pp. 581-583.

"Quantum Well Intermixing for Photonic Applications," E. Herbert Li, et al , Proceedings of SPIE vol. 3944 (2000).

"Impurity Induced Layer Disordering of Quantum-Well Heterostructures: Discovery and Prospects," Nick Holonyak, IEEE J. of Selected Topics in Quantum electronics, vol. 4, No. 4, Jul./Aug. 1998 pp. 584-594.

"Quantum well intermixing," John H. Marsh, Semicon. Sci. Technol. 8 (1996) 1136-1155.

"On Tuning Efficiency of Sampled Grating DBR Lasers using Quantum Well Intermixing," Trends in Optics and Photonics Series, Integrated Photonics Research, Optical Society of America vol. 78.

Song et al.; "High Power 1060nm DBR Lasers With Quantum Well Intermixed Passive Sections"; Oct. 2005; pp. 949-950.

Marsh et al.; "The Role of Monolithic Integration in Advanced Laser Products"; Journal of Crystal Growth; vol. 288, No. 1; Feb. 2006; pp. 2-6.

Marsh et al.; "Fabrication of Photonic Integrated Circuits Using Quantum Well Intermixing"; Materials Science and Engineering B; vol. 28, No. 1/3; Dec. 1994; pp. 272-278.

Yanson et al.; "Post-Growth Bandgap Engineering in InP"; 2005 International Conference on Indium Phosphide and Related Materials; May 2005; pp. 504-507.

"Interdiffusion Mechanisms in GaAs/AlGaAs Quantum Well Heterostructures Induced by SiO2 Capping and Annealing" A. Pepin, Mat. Res. Soc. Symp. Proc. vol. 484 pp. 447-452.

\* cited by examiner

QUANTUM WELL INTERMIXING

BACKGROUND

Embodiments of the present invention are generally related to quantum well intermixing (QWI) in semiconductor materials, and is specifically related to QWI methods operable to achieve sufficient band gap shifts while maintaining good surface morphology and material quality of the semiconductor materials.

SUMMARY

The present inventors have recognized that Quantum Well Intermixing (QWI) is a suitable process for achieving monolithic optoelectronic integration. Quantum well intermixing is a post-growth process to selectively modify a semiconductor material band gap through inter-diffusion of atomic species between a quantum well and barrier at elevated temperatures. The interdiffusion of elements of a quantum well and the associated barriers produce an "intermixed" region which has a band-gap larger than that of the as-grown quantum well. The QWI technique is based on the principle that a quantum well is an inherently unstable system due to an abrupt change of concentration of atomic species across the well/barrier interface. Any optical radiation (light) generated within the quantum well where no or little QWI has taken place ("non-mixed" region) can therefore pass through a QWI or "intermixed" region of alloys which are effectively transparent to the optical radiation.

The present inventors have also recognized that optical and electric properties of the quantum well play a key role in semiconductor optoelectronic devices such as light emitters, detector, modulators, filters, amplifiers, waveguide, switches, etc. When combining these components into a monolithic optical or optoelectronic integration circuit, the band gap wavelength variation along the optical path is important. Moreover, even in discrete devices such as laser diodes, having different band gap wavelengths in the different regions may improve laser performance or reliability.

The present inventors have recognized the desirability of improved methods of quantum well intermixing to develop improved semiconductor wafer components, especially components for laser applications.

According to one embodiment, a method of quantum well intermixing (QWI) is provided. The method includes the steps of: providing a wafer comprising upper and lower epitaxial layers, and a quantum well layer disposed between the upper and lower epitaxial layers; applying at least one sacrificial layer over the upper epitaxial layer; and forming a QWI enhanced region and a QWI suppressed region by applying a QWI enhancing layer over a portion of the sacrificial layer. The portion under the QWI enhancing layer is the QWI enhanced region, and the other portion is the QWI suppressed region. The method further includes the steps of applying a QWI suppressing layer over the QWI enhanced region and the QWI suppressed region; and annealing at a temperature sufficient to cause interdiffusion of atoms between the quantum well layer and barrier layers which are a part of the upper epitaxial layer and the lower epitaxial layer.

Other embodiments may include the step of forming a QWI enhanced region and a QWI suppressed region by applying a QWI enhancing layer comprising WN over a portion of the wafer. The WN film may be applied over the wafer or over one or more of the sacrificial layers applied over the wafer.

Still further embodiments may include the step of applying a QWI suppressing layer comprising a silicon oxide layer and a silicon nitride layer over the QWI enhanced region and the QWI suppressed region.

These and additional features provided by the embodiments of the present invention will be more fully understood in view of the following detailed description, in conjunction with the drawings.

BRIEF DESCRIPTION OF THE DRAWINGS

The following detailed description of specific embodiments of the present invention can be best understood when read in conjunction with the drawings enclosed herewith. The drawing sheets include.

Figure 1:
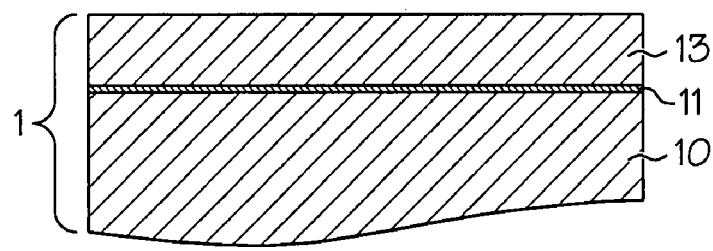
FIG. 1 is a cross-sectional schematic view of a cross section of a semiconductor laser structure comprising a quantum well disposed between upper and lower epitaxial layers containing barrier layers next to the quantum well according to one or more embodiments of the present invention.
Figure 2:
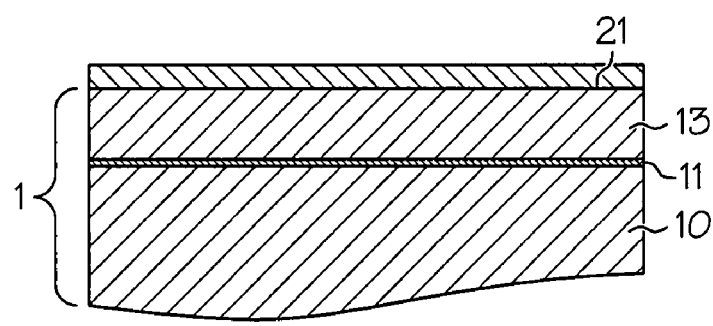
FIG. 2 is a cross-sectional schematic view illustrating the application of a sacrificial layer onto the structure of FIG. 1 according to one or more embodiments of the present invention.

The embodiments set forth in the drawings are illustrative in nature and not intended to be limiting of the invention defined by the claims. Moreover, individual features of the drawings and the invention will be more fully apparent and understood in view of the detailed description.

DETAILED DESCRIPTION

Embodiments of the present invention relate generally to semiconductor optical and optoelectronic devices and particularly, though not exclusively, to semiconductor lasers. The invention specifically relates to an impurity-free Quantum Well Intermixing (QWI) technique, which does not introduce any impurities during the processing. In one application, this technique may be utilized in the fabrication of single wavelength 1060 nm distributed Bragg reflector (DBR)

lasers. QWI provides a method to effectively modify band gaps in selected areas of III-V semiconductor wafers to produce different sections of different functionality such as gain, phase, and DBR sections and transparent window facets in DBR laser diodes.

Figure 6:
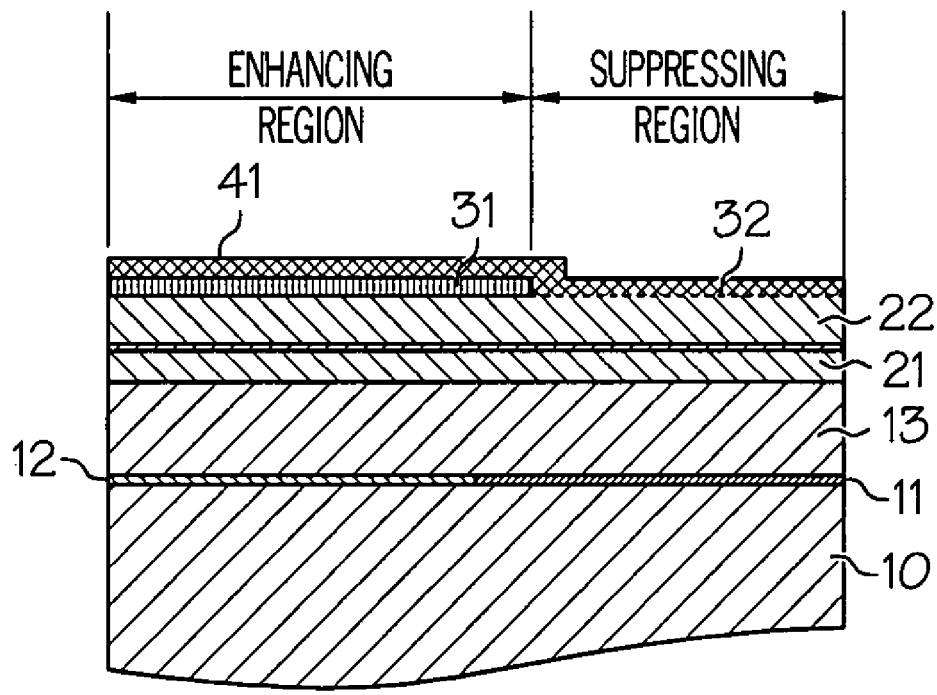
FIG. 6 is a cross-sectional schematic view illustrating an intermixed quantum well after rapid thermal annealing according to one or more embodiments of the present invention.
Figure 7:
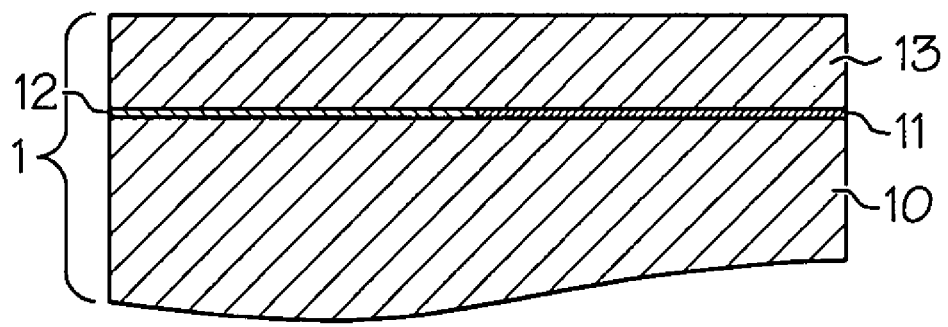
FIG. 7 is a cross-sectional schematic view illustrating the semiconductor structure of FIG. 6 after etching steps were conducted according to one or more embodiments of the present invention.
Figure 8A:
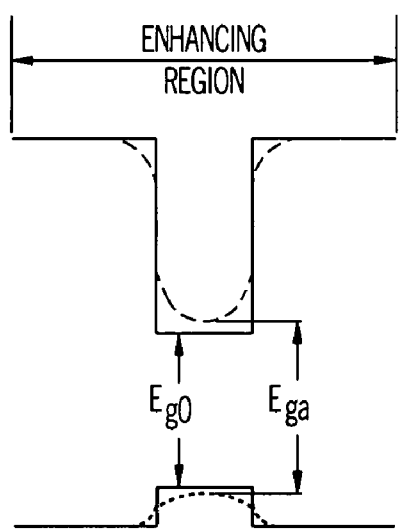
FIG. 8a is a schematic view comparing the quantum well band gaps in a QWI enhanced region according to one or more embodiments of the present invention.
Figure 8B:
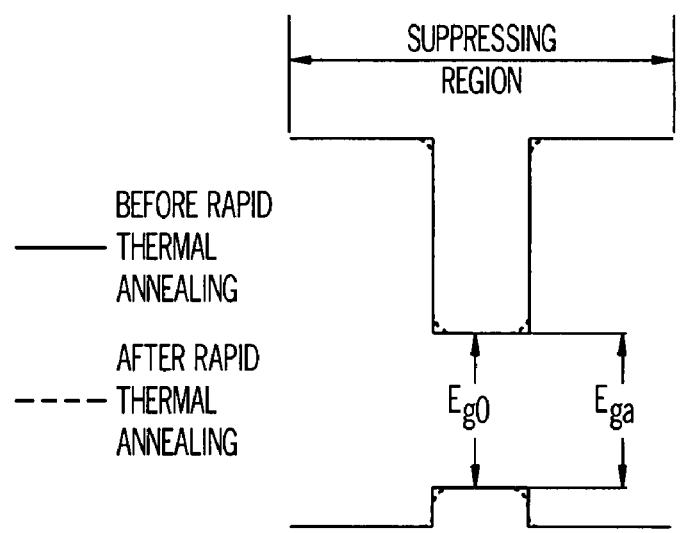
FIG. 8b is a schematic view comparing the quantum well band gaps in a QWI suppressed region according to one or more embodiments of the present invention.

Referring generally to FIGS. 1 through 7, a method of quantum well intermixing (QWI), specifically a method of impurity free quantum well intermixing, is provided. Referring to FIG. 1, a wafer 1 is provided. The wafer 1 may comprise numerous suitable structures. As shown in FIG. 1, the wafer 1 may be a graded-index-separate-confinement heterostructure (GRINSCH) laser structure with a strained quantum-well layer 11 sandwiched between an upper epitaxial layer 13 and a lower epitaxial layer 10. As used herein, each epitaixial layer may comprise multiple sublayers or components, for example, and not by way of limitation, a waveguide layer with graded composition, a cladding layer, and a barrier layer. In one embodiment of a GRINSCH structure, the bandgap of the waveguide composition changes continuously from a small bandgap near the barrier to the high bandgap near the cladding layer. The upper epitaxial layer 13 and the lower epitaxial layer 10 may comprise various compositions, e.g. $Al_xGa_{1-x}As$. The epitaxial layers may comprise various thicknesses. For example, the upper epitaxial layer 13 may comprise a thickness of about 1600 nm and the lower epitaxial layer may comprise a thickness of about 5110 nm. Similarly, the quantum well layer 11 may comprise various well sizes and various compositions suitable for quantum well intermixing. In one embodiment, the quantum well layer 11 may comprise InGaAs. Determining whether a composition is suitable for QWI may depend on numerous factors, such as concentration gradients between the quantum well and barrier. For example, in an AlGaAs barrier/InGaAs well embodiment having a 980-nm quantum well, the indium concentration may change from 18% to 0 in a distance of less than 5 angstroms. Referring generally to FIGS. 8a, and 8b, this abrupt concentration gradient, at elevated temperature, causes diffusion of atomic species, thereby resulting in an interdiffusion of the quantum well 11 alloys and epitaxial layer 10, 13 alloys. This produces a shape change of the well and band gap as shown in FIG. 8a. This atomic diffusion rate can be greatly enhanced by the presence of impurities, defects, or vacancies in the vicinity of the quantum well interfaces. Spatially changing vacancies provide a way to selectively enhance the diffusion and selectively modify the band gap. To simplify the discussion, the present invention describes quantum well interdiffusion for semiconductor laser systems with one quantum well; however it is contemplated that interdiffusion may occur in semiconductor laser systems comprising multiple quantum wells Referring to the embodiment of FIG. 2, a sacrificial layer 21 is grown over the upper epitaxial layer 13 of the wafer 1. As used herein, the term "over" means that one layer is applied on, but not necessarily directly on another layer. In the present invention, the addition of intervening layers is contemplated herein. Furthermore, the term "over" does not require that the layer cover the entire surface, any may only include partial coverage. The sacrificial layer 21 may comprise GaAs with a thickness of about 20 nm. Other compositions thicknesses may be desirable depending on the laser application, or the compositions of the wafer 1. The sacrificial layer 21 may be grown or deposited via various techniques, for example, metalorganic chemical vapor deposition (MOCVD). Upon growing the sacrificial layer 21 on the wafer, the wafer 1 and sacrificial layer 21 thereon may be unloaded from the metalorganic chemical vapor deposition (MOCVD) system and then exposed to the atmosphere for a period sufficient period, (e.g. a few hours).

Figure 4:
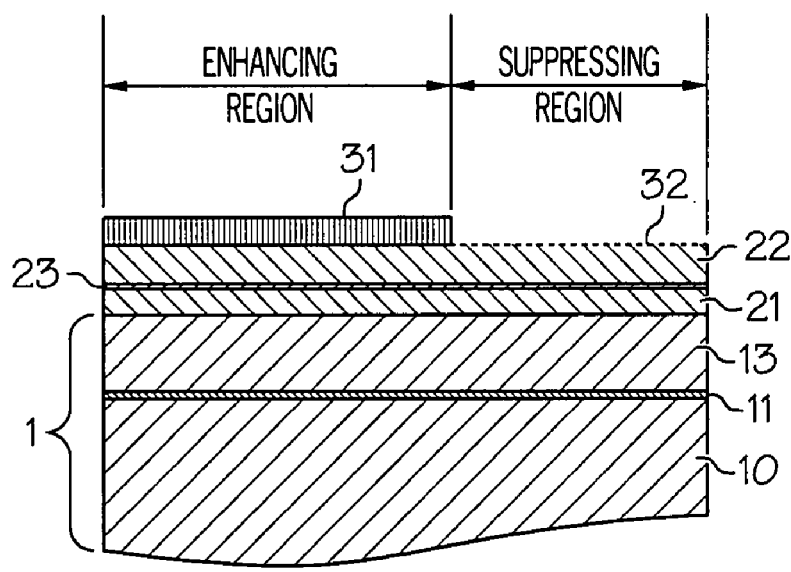
FIG. 4 is a cross-sectional schematic view illustrating the application of a QWI enhancing layer onto the structure of FIG. 3, as well as the ion milling of the structural surface of FIG. 3 according to one or more embodiments of the present invention.
Figure 5:
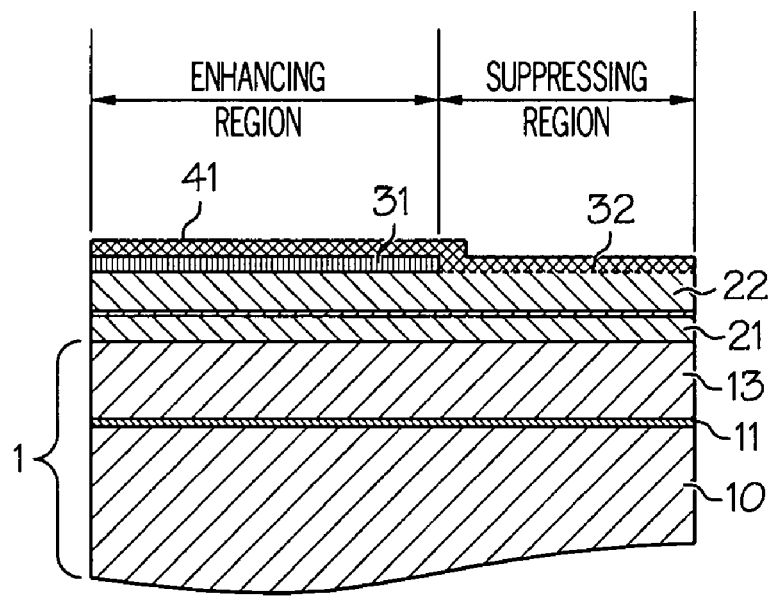
FIG. 5 is a cross-sectional schematic view illustrating the application of a QWI suppressing layer onto the structure of FIG. 4 according to one or more embodiments of the present invention.

The sacrificial layer 21 is configured to prevent defect formation on the surface of the upper epitaxial layer 13 during the following QWI process. In conventional processes, QWI and other associated processing steps may cause poor surface morphology on the wafer 1 e.g. on the upper epitaxial layer 13 of the wafer 1. For example, damage may be caused during deposition (sputtering or PECVD) of the QWI enhancing 31 layer (as shown in FIG. 4) and or the deposition of the QWI suppressing layer 41 (as shown in FIG. 5). Moreover, the reactions or interdiffusions between the semiconductor and dielectric films during high temperature annealing may contribute to the poor surface morphology. Poor surface morphology deteriorates crystal quality and negatively impacts laser processing and operations. To combat this poor morphology, the sacrificial layer 21, which is typically removed by etching after the QWI step, absorbs the damage caused by these processes and thereby protects against damage to the wafer 1.

Figure 3:
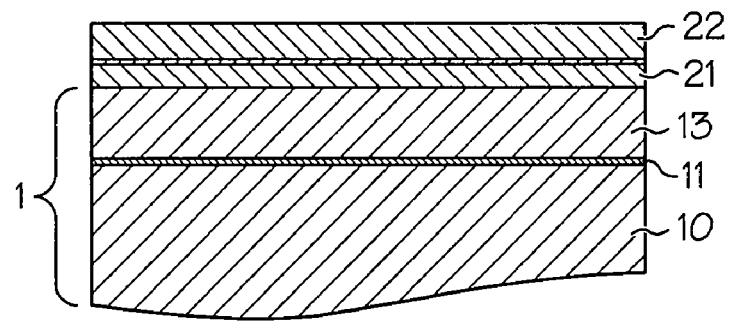
FIG. 3 is a cross-sectional schematic view illustrating the application of a sacrificial regrowth layer onto the structure of FIG. 2 according to one or more embodiments of the present invention.

Referring to FIG. 3, a sacrificial regrowth layer 22 may be applied over the sacrificial layer 21. Like the sacrificial layer 21, the sacrificial regrowth layer 22 may also be applied via metalorganic chemical vapor deposition (MOCVD), or other suitable deposition techniques. In some embodiments, the sacrificial regrowth layer 22 may comprise the same composition as the sacrificial layer 21, e.g. GaAs; however, other compositions are contemplated herein. Similarly, the sacrificial regrowth layer 22 may include varying thicknesses as desired. In the embodiment of FIG. 3, the sacrificial regrowth layer 22 may comprise a GaAs composition with a thickness of about 130 nm.

The sacrificial regrowth layer 22 is operable to act as an additional enhancing layer, because the regrown interface between the layer 21 and 22 may enhance the vacancy diffusion located under the QW enhancing layer. More details regarding enhancing layers and the importance of vacancies and defects for atomic interdiffusion are provided below. In other embodiments, it may desirable to use multiple sacrificial regrowth layers in order to facilitate further vacancy diffusion during QWI.

Referring to the embodiment of FIG. 4, a QWI enhancing layer 31 may be applied over a portion of the sacrificial regrowth layer 22. In embodiments which do not include the application of the sacrificial regrowth layer 22, and/or the sacrificial layer 21, the QWI enhancing layer 31 may also be applied over the sacrificial layer 21 or the upper epitaxial layer 13 of the wafer 1. As shown in FIG. 4, the portion of the wafer 1 and layers thereon located under the QWI enhancing layer 31 is the QWI enhanced region. The remaining portion, or at least part of the remaining portion, is the QWI suppressed region. The QWI enhancing layer 31 may be applied via various suitable techniques, e.g., radio frequency biased sputtering, magnetron sputtering, active biased sputtering, or combinations thereof. The QWI enhancing layer 31 may comprise any composition suitable to form vacancies or defects, which facilitate atomic interdiffusion during high temperature annealing. In one embodiment, the QWI enhancing layer 31 comprises tungsten nitride (WN). Because tungsten nitride is a hard, dense, chemically inert, thermally stable compound with a high melting point, it is a highly effective QWI enhancing layer 31 material. A solid dense WN film can effectively protect a semiconductor surface from decomposition, while its chemical inertness minimizes reactions between the WN film and layers adjacent the WN film. Moreover, the high thermal stability of the WN film is effective for the high temperature annealing step associated with QWI.

The microstructure of the WN film is also beneficial, especially at high temperatures. During QWI, blue shifts (i.e. changes in the band gap during QWI) in the intermixing process greatly depend on atomic (e.g. Ga) vacancy diffusion. At high annealing temperatures (e.g. greater than 700° C.), the microstructure of a WN film changes to a well-defined columnar structure with tiny grains perpendicularly extending through the whole film thickness. This columnar structure greatly increases the Ga vacancies of the underneath epitaxial layers, and thereby promotes the blue shifts of the quantum well bandgap wavelength in the enhancing region.

After the sputter deposition, the QWI enhancing layer 31 may, in further exemplary embodiments, undergo additional treatment steps. For example, the QWI enhancing layer 31 may be patterned using photolithography. In a further example, a portion of the QWI enhancing layer 31 may be etched using wet or dry etching. The etching may help to define boundaries between the enhancing region and the suppression region.

As described above, the sacrificial regrowth layer 22 may assist the QWI enhancing layer 31 by acting as an additional enhancing layer. The sputter deposition of the QWI enhancing layer 31 produces atomic vacancies or defects in the sacrificial regrowth layer 22, which facilitates greater interdiffusion of atoms during high temperature annealing. By having multiple regrowth interfaces between the neighboring enhancing layers, the band gap shift will greatly increase in the enhancing region of the quantum well 11.

Referring to FIG. 5, the method of the present invention also comprises applying a QWI suppressing layer 41 over the QWI enhanced region and the QWI suppressed region. As shown in the embodiment of FIG. 5, the QWI suppressing layer 41 may contact the QWI enhancing layer 31 and the sacrificial regrowth layer 22. In other embodiments, specifically embodiments that do not include one or both sacrificial layers 21, 22, the QWI suppressing layer 41 may contact the sacrificial layer 21 or the upper epitaxial layer 13. The QWI suppressing layer 41 may comprise various suitable compositions, for example, silicon based compositions. As shown in the embodiment of FIG. 5, the QWI suppressing layer 41 may comprise a silicon nitride layer and a silicon oxide layer. It is contemplated that the QWI suppressing layer 41 may comprise separate silicon nitride ($Si_xN_y$) and silicon oxide ($SiO_2$) layers, or may comprise a single hybrid layer with both compositions dispersed therein. The QWI suppressing layer 41 may be applied through various deposition techniques, for example, (PECVD) plasma enhanced chemical vapor deposition. In one embodiment, the QWI enhancing layer may comprise a $Si_xN_y$ film with a thickness of 100 nm and a $SiO_2$ film with a thickness of 200 nm.

In operation, the silicon nitride may act as a suppression cap, while the silicon oxide layer provided thereon compensates for stresses caused by high temperature annealing and maintains the integrity of the QWI suppressing layer 41. The silicon nitride also provides additional benefits, because it is easy to remove and leaves no defects or excess material on the semiconductor surface. Furthermore, the silicon nitride protects the underneath crystalline quality of the wafer 1 during high temperature annealing, which is desirable for high performance structures.

In yet another embodiment, pretreatment steps may be utilized prior to the application of the QWI suppressing layer 41. For example, a surface of the suppressing region, for example, the sacrificial regrowth layer 22, may undergo ion milling prior to the application of the QWI suppressing layer 41. Ion milling removes sputter-induced surface defects caused by the application of the QWI enhancing layer 31. Sputter induced surface defects are a driving force of band gap shifts in the enhanced region; however, the suppression region seeks to minimize these band gap shifts. Thus, it may be necessary to use treatment processes like ion milling to remove these surface defects in the suppressed region. Referring to FIG. 4, the ion milling process may remove a few hundred angstroms of a surface layer using energized ions, for example, argon ions to produce an ion milled surface 32. Utilizing an ion milling procedure in combination with a silicon based QWI suppressing layer 41 reduces the unwanted bandgap wavelength shift in the suppression region to maximize the band gap differential between the enhanced and suppressed regions of the quantum well after QWI.

Referring to the embodiment of FIG. 6, the quantum well intermixing step is then conducted by annealing the coated wafer 1 at a temperature sufficient to cause interdiffusion of atoms between the quantum well layer 11 and the nearby barriers which are a part of the upper epitaxial layer and the lower epitaxial layer. Referring to FIG. 7, this interdiffusion produces an intermixed well 12 in the enhancing region. Various processing times, and temperatures are contemplated herein. In one embodiment, the coated wafer may be heated 4 times at 850° C. for 35 seconds each time.

After the QWI annealing step, the method may include the step of etching the sacrificial layer and all layers above the sacrificial layer of the wafer 1. The etching may include any suitable technique, for example wet etching or dry etching. Other processes such as grating fabrication are also contemplated herein.

The quantum well intermixing results from a crystal constituent species diffusion between well and barrier. This diffusion process is governed by Fick's Law $$J = -D\frac{\partial N}{\partial X}$$

Where J is the diffusion flux along the diffusion direction X, and N is the concentration of volume species. D is defined as diffusion coefficient and can be expressed in Arrhenius form $$D = D_0 \exp[-E_0/kT]$$

Referring to FIG. 7, at elevated temperature, the diffusion coefficient D in the enhanced region is significantly enhanced due to the high concentration of Ga vacancy at the top of GaAs surface created by bias sputtering, and the unique columnar microstructure of WN film, which functions as a sink of Ga to promote the vacancy interdiffusion. It is this vacancy diffusion that significantly enhances the atom interdiffusion between barriers and well, which hence creates a shape change in the enhanced region of the quantum well, as shown in FIG. 8*a*. In the suppressed region, which substantially lacks these defects or vacancies, the diffusion coefficient is much lower than the diffusion coefficient in the enhanced region. As a result, the quantum well shape in the suppressed region demonstrates almost no change before and after annealing as shown in FIG. 8*b*. Referring to FIGS. 8*a* and 8*b*, the band gap of the quantum well in enhanced region is increased from $E_{g0}$ to $E_{ga}$ after annealing, but the band gap in the suppressed region is almost unchanged after annealing.

Band gap shift of up to 100 nm are contemplated herein. In one exemplary embodiment, a structure like that of FIG. 7 was analyzed using a photoluminescence (PL) measurement to evaluate the band gap shift between the enhanced and suppressed regions. In the experiment, the suppressed region of the quantum well had a band gap wavelength of 1045 nm after annealing. In contrast, the enhanced region of the quantum well had a band gap wavelength of 983 nm after annealing, thereby demonstrating a differential band gap shift of about 62 nm. It was also found that the structure may produce a record high single mode output power of 480 mW.

As described above, the structures produced by the QWI method of the present invention may be utilized in the fabrication of DBR lasers. The intermixed section 12 of the quantum well 11 will be processed as the DBR and phase sections and transparent window facets in DBR laser diodes. The suppression area having no or little band gap shift will be the gain section in DBR laser diodes. In one embodiment of DBR fabrication, photolithography may be used to pattern the wafer again to define the DBR/phase/gain/window sections. Subsequently, the wafer may be loaded into the MOCVD reactor for an upper epitaxial layer and a contact layer regrowth. After regrowth, the wafer then undergoes a standard DBR laser process to form DBR lasers. Other structural components and layers are contemplated for the DBR laser. In other designs, other layers such as etch stop layers and grating layers may also be used depending on laser application.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A method of quantum well intermixing (QWI) comprising:
   providing a wafer comprising upper and lower spatial layers, and at least one quantum well layer disposed between the upper and lower epitaxial layers, wherein the upper and lower epitaxial layers each comprise an barrier layer;
   applying at least one sacrificial layer over the upper epitaxial layer;
   forming a QWI enhanced region and a QWI suppressed region by applying a QWI enhancing layer over a portion of the sacrificial layer, wherein the portion under the QWI enhancing layer is the QWI enhanced region, and the other portion is the QWI suppressed region;
   applying a QWI suppressing layer over the QWI enhanced region and the QWI suppressed region; and
   annealing at a temperature sufficient to cause interdiffusion of atoms between the at least one quantum well layer and the barrier layers of the upper epitaxial layer and the lower epitaxial layer.

2. The method according to claim 1 wherein the wafer is a graded-index-separate-confinement heterostructure.

3. The method according to claim 1 wherein the at least one quantum well layer comprises InGaAs.

4. The method according to claim 1 wherein the upper and lower epitaxial layers comprise $Al_xGa_{1-x}As$.

5. The method according to claim 1 wherein the upper and lower epitaxial layers comprise barrier layers, waveguides, and cladding layers.

6. The method according to claim 1 wherein the sacrificial layer is configured to prevent defect formation on the surface of the upper epitaxial layer.

7. The method according to claim 1 further comprising applying a or multiple sacrificial regrowth layers over the sacrificial layer, the sacrificial regrowth layers being operable to act as an additional enhancing layer.

8. The method according to claim 7 wherein a sputter deposition of the QWI enhancing layer produces atomic vacancies in the sacrificial regrowth layer.

9. The method according to claim 7 further comprising exposing the sacrificial layer to the atmosphere prior to application of the sacrificial regrowth layer.

10. The method according to claim 7 wherein the sacrificial layer and the sacrificial regrowth layer comprise GaAs.

11. The method according to claim 7 wherein the sacrificial layer and the sacrificial regrowth layer are applied via metalorganic chemical vapor deposition (MOCVD).

12. The method according to claim 7 wherein the sacrificial layer comprises a thickness of about 20 nm and the sacrificial regrowth layer comprises a thickness of about 130 nm.

13. The method according to claim 1 further comprising etching the sacrificial layer and all layers above the sacrificial layer after the annealing step.

14. The method according to claim 1 further comprising ion milling a surface of the suppressing region prior to the application of the QWI suppressing layer.

15. The method according to claim 1 wherein the QWI enhancing layer comprises WN.

16. The method according to claim 1 wherein the QWI enhancing layer is applied via radio frequency biased sputtering, magnetron sputtering, active biased sputtering, or combinations thereof.

17. The method according to claim 1 further comprising patterning the QWI enhancing layer using photolithography.

18. The method according to claim 1 further comprising etching a portion of the QWI enhancing layer.

19. The method according to claim 1 wherein the QWI suppressing layer comprises a silicon nitride layer and a silicon oxide layer.

20. The method according to claim 1 wherein the QWI suppressing layer is applied via (PECVD) plasma enhanced chemical vapor deposition.

21. The method according to claim 1 wherein the interdiffusion of atoms produces a band gap shift of up to about 100 nm in the QWI enhanced region and substantially no band gap shift in the QWI suppressed region.

22. A DBR laser produced by the method of claim 1.

23. The DBR laser of claim 22 wherein the portion of the quantum well in the QWI enhanced region is operable to function as a DBR section, a phase section, transparent window facets or combinations thereof, and the portion of the quantum well in the QWI suppressed region is operable to function as a gain section.

24. A method of quantum well intermixing (QWI) comprising:
   providing a wafer comprising upper and lower epitaxial layers, and a quantum well layer disposed between the upper and lower epitaxial layers, wherein the upper and lower epitaxial layers each comprise a barrier layer, a waveguide layer and a cladding layer;
   forming a QWI enhanced region and a QWI suppressed region by applying a QWI enhancing layer comprising WN over a portion of the wafer, wherein the portion of the wafer is the QWI enhanced region, and the other portion is the QWI suppressed region;
   applying a QWI suppressing layer over the QWI enhanced region and the QWI suppressed region; and annealing at a temperature sufficient to cause interdiffusion of atoms between the at least one quantum well layer and the barrier layers of the upper epitaxial layer and the lower epitaxial layer.

25. The method according to claim 24 wherein the QWI enhancing layer is applied via radio frequency biased sputtering, magnetron sputtering, active biased sputtering, or combinations thereof.

26. A method of quantum well intermixing (QWI) comprising:

provniding a wafer comprising upper and lower epitaxial layers, and a quantum well layer disposed between the upper and lower epitaxial layers, wherein the upper and lower epitaxial layers each comprise a barrier layer, a waveguide layer and a cladding layer;

forming a QWI enhanced region and a QWI suppressed region by applying a QWI enhancing layer over a portion of the wafer, wherein the portion of the wafer is the QWI enhanced region, and the other portion is the QWI suppressed region;

applying a QWI suppressing layer comprising a silicon nitride layer and a silicon oxide layer over the QWI enhanced region and the QWI suppressed region; and annealing at a temperature sufficient to cause interdiffusion of atoms between the at least one quantum well layer and the barrier layers of the upper epitaxial layer and the lower epitaxial layer.

* * * * *

UNITED STATES PATENT AND TRADEMARK OFFICE
CERTIFICATE OF CORRECTION

| | | |
|---|---|---|
| PATENT NO. | : 7,723,139 B2 | Page 1 of 1 |
| APPLICATION NO. | : 11/906247 | |
| DATED | : May 25, 2010 | |
| INVENTOR(S) | : Li et al. | |

It is certified that error appears in the above-identified patent and that said Letters Patent is hereby corrected as shown below:

Col. 7, Line 37, Claim 1 "spatial" should read --epitaxial--

Signed and Sealed this

Fourteenth Day of September, 2010

David J. Kappos
*Director of the United States Patent and Trademark Office*